United States Patent
Tran et al.

(10) Patent No.: US 8,058,667 B2
(45) Date of Patent: Nov. 15, 2011

(54) LEADFRAME PACKAGE FOR LIGHT EMITTING DIODE DEVICE

(75) Inventors: Nguyen The Tran, Garden Grove, CA (US); Yongzhi He, Irvine, CA (US); Frank Shi, Irvine, CA (US)

(73) Assignee: Nepes LED Corporation, Chungcheongbuk-do (KR)

( * ) Notice: Subject to any disclaimer, the term of this patent is extended or adjusted under 35 U.S.C. 154(b) by 26 days.

(21) Appl. No.: 12/381,408

(22) Filed: Mar. 10, 2009

(65) Prior Publication Data
US 2010/0230708 A1      Sep. 16, 2010

(51) Int. Cl.
*H01L 33/00* (2010.01)
(52) U.S. Cl. ............ 257/99; 257/79; 257/81; 257/88; 257/98; 257/687; 257/712; 257/E23.007; 257/E23.011; 257/E23.104; 438/26; 438/27
(58) Field of Classification Search .......... 257/79, 257/88, 98, 81, 82, 91, 99, 100, 116, 117, 257/432, 433, 434, 435, 436, 437, 749, E33.056, 257/E33.057, E33.058, E33.059, E25.032, 257/19, 687, 712, E23.007, E23.011, E23.104; 438/26, 27, 25, 28, 29, 30, 31, 32, 33, 34, 438/35
See application file for complete search history.

(56) References Cited

U.S. PATENT DOCUMENTS

| | | | |
|---|---|---|---|
| 6,896,381 B2 | 5/2005 | Benitez et al. | |
| 2005/0218421 A1* | 10/2005 | Andrews et al. | 257/100 |
| 2006/0133044 A1* | 6/2006 | Kim et al. | 361/704 |
| 2007/0063321 A1* | 3/2007 | Han et al. | 257/675 |
| 2008/0012036 A1* | 1/2008 | Loh et al. | 257/99 |
| 2008/0023721 A1 | 1/2008 | Lee et al. | |
| 2008/0026498 A1* | 1/2008 | Tarsa et al. | 438/26 |
| 2008/0048201 A1 | 2/2008 | Kim et al. | |
| 2008/0083931 A1* | 4/2008 | Bando et al. | 257/99 |
| 2009/0134408 A1* | 5/2009 | Park et al. | 257/88 |
| 2010/0163918 A1 | 7/2010 | Kim et al. | |

OTHER PUBLICATIONS

USPTO OA mailed Aug. 23, 2010 in connection with U.S. Appl. No. 12/381,409.

* cited by examiner

*Primary Examiner* — Benjamin Sanvik
*Assistant Examiner* — Farid Khan
(74) *Attorney, Agent, or Firm* — Ladas & Parry LLP

(57) ABSTRACT

An LED leadframe package with surface tension function to enable the production of LED package with convex lens shape by using dispensing method is disclosed. The LED leadframe package of the invention is a PPA supported package house for LED packaging with metal base, four identical metal electrodes, and PPA plastic to fix the metal electrodes and the heat dissipation base together, four ring-alike structures with a sharp edge and with a tilted inner surface, and three ring-alike grooves formed between sharp edge ring-alike structures.

14 Claims, 3 Drawing Sheets

LEADFRAME PACKAGE FOR LIGHT EMITTING DIODE DEVICE

BACKGROUND OF INVENTION

1. Field of the Invention

This invention discloses an LED (light emitting diode) leadframe package having sharp edge structures that enable surface tension function to make an LED package with convex lens shape, and an LED package using the LED leadframe package of the invention.

2. Background Art

In order to improve light output from an LED package, a convex lens structure is introduced to the outer optical layer of the LED package. In conventional LED packages, the convex lens structure is formed by picking a pre-made optical lens and placing it onto of the LED package. This additional step requires an extra investment in at least one more machine. Moreover, the package using the pick-and-place step for making convex structure can have bubbles at the interface between the pre-made convex lens and the encapsulation layer. Therefore, it has a low manufacturing yield and increases the manufacturing cost of the LED package.

Another method of forming a convex lens structure is the use of injection molding method. However, this method is well-known in associating with the waste of silicone materials. Therefore, the manufacturing cost of the LED package is also high.

SUMMARY OF INVENTION

The present invention discloses a leadframe package through which a convex lens shape can be formed with a single step by utilizing the surface tension feature that is enabled by sharp edge structures of the leadframe package of the invention.

The LED leadframe package of the invention is a PPA supported package house for LED packaging with four identical metal leads acting as electrodes, a heat dissipation base, a PPA plastic to fix the metal leadframe and the heat dissipation base together, sharp, edge ring-alike structures with a tilted inner surface, and ring-alike grooves formed between sharp edge ring-alike structures.

The word "LED leadframe package" used through the rest of the patent is referred to a PPA supported package house for LED packaging with metal heat dissipation base, metal electrodes, and PPA plastic.

The LED leadframe package of the invention has plurality of sharp edge ring-alike structures with a larger ring-alike structure around a smaller ring-alike structure. Two adjacent ring-alike structures are separated by a distance, forming a ring-alike groove between them.

DETAILED DESCRIPTION OF THE INVENTION

The present invention discloses a leadframe package through which a convex lens shape can be formed with a single step by utilizing the surface tension feature that is enabled by sharp edge structures of the leadframe package of the invention.

Figure 1:
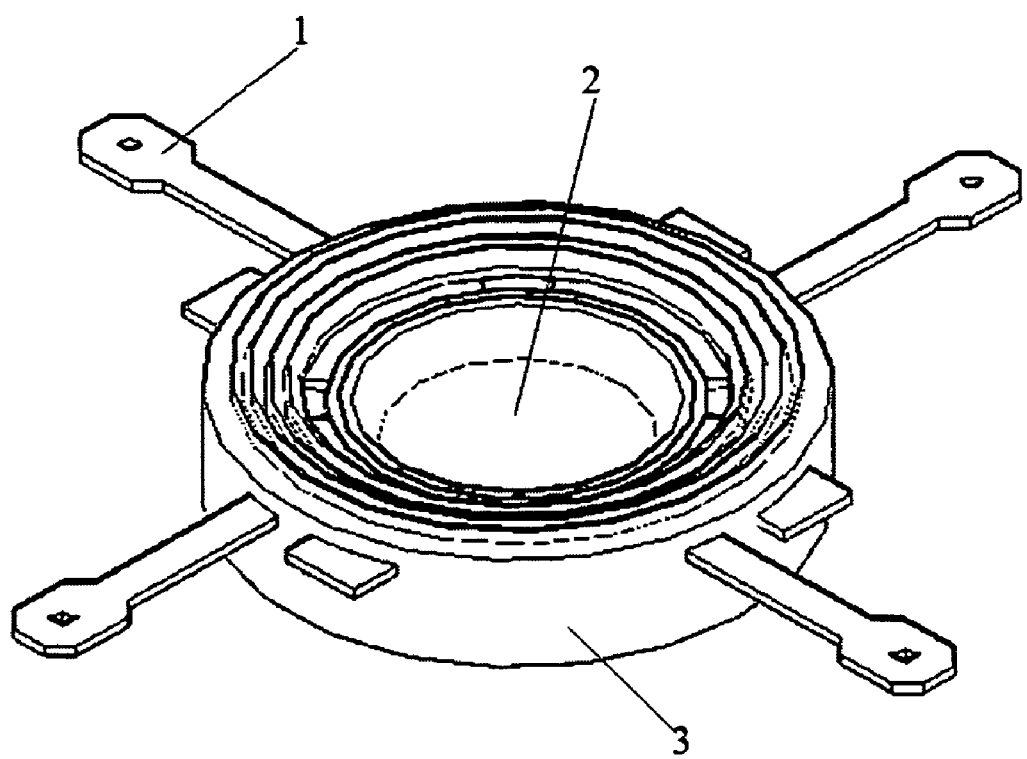
FIG. 1 is a perspective view of the LED leadframe package of the invention
Figure 2:
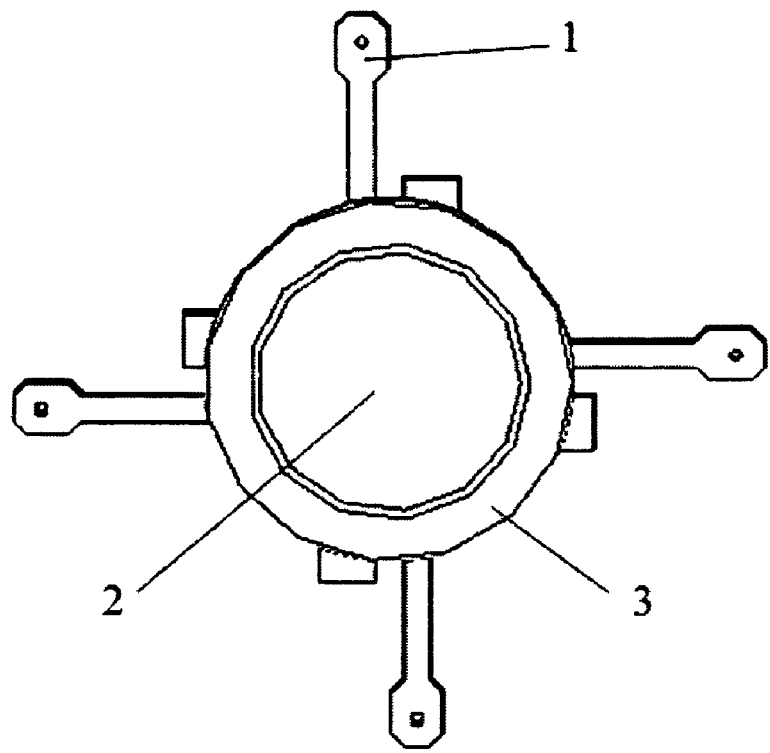
FIG. 2 is a bottom view of the LED leadframe package of the invention
Figure 3:
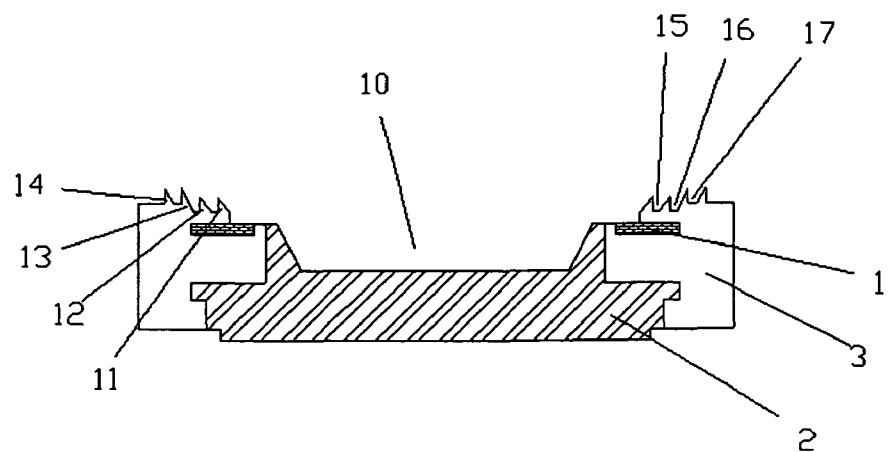
FIG. 3 is a cross-sectional view of the LED leadframe package of the invention

The LED leadframe package of the invention shown in FIG. 1, FIG. 2, and FIG. 3 comprises of four identical metal electrodes 1, a heat dissipation base 2, a PPA plastic 3 to fix the metal electrodes 1 and the heat dissipation base 2 together, sharp edge ring-alike structures 11, 12, 13, and 14 with a tilted inner surface, and ring-alike grooves 15, 16, and 17 formed between sharp edge ring-alike structures.

The heat dissipation base has a cavity or reflective cup 10 coated with high reflective material such as silver or aluminum at the center of the heat dissipation base. The metal four identical metal electrodes 1 are arranged in a circular direction. Each metal electrode is apart from adjacent lead by 90 degrees in rotation around the axis going through the center of the heat dissipation base and perpendicular to the center surface. The top surface of four identical electrodes is in the same height as the highest point of the heat dissipation base, which is the top of the reflective cup 10. The surfaces of four identical metal electrodes 1 are coated with high reflective materials such as silver or aluminum.

The metal electrodes 1, the heat dissipation base 2, and the PPA plastic for fixing the metal electrodes 1 and the heat dissipation base 3 together, are bind together by using injection molding method.

Sharp edge ring-alike structures 11, 12, 13, and 14 with a tilted inner surface, and ring-alike grooves 15, 16, and 17 are part of the PPA plastic 3 and are formed by using molding methods such as transfer molding.

Figure 4:
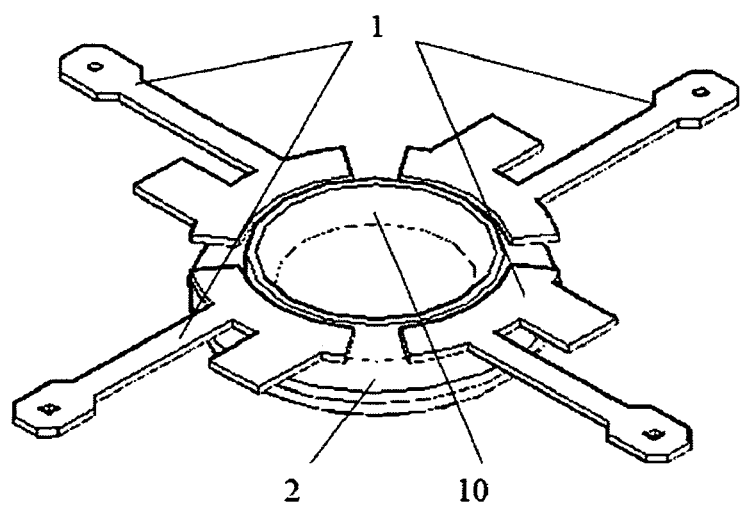
FIG. 4 is a perspective view of the LED leadframe package of the invention without the PPA plastic structure

The LED leadframe package of the invention is fabricated by making the metal lead 1 and the heat dissipation base 2 with the desired geometries shown in FIG. 4. The surfaces of the metal electrodes 1 and the heat dissipation base 2 are coated with high reflective materials. The metal electrodes 1 and the heat dissipation base 2 are then fastened to a mold followed by the molding process to form the PPA plastic 3. The mold has the structure that results in sharp edge ring-alike structures 11, 12, 13, and 14 with a tilted inner surface, and ring-alike grooves 15, 16, and 17 after the mold is released.

Figure 5:
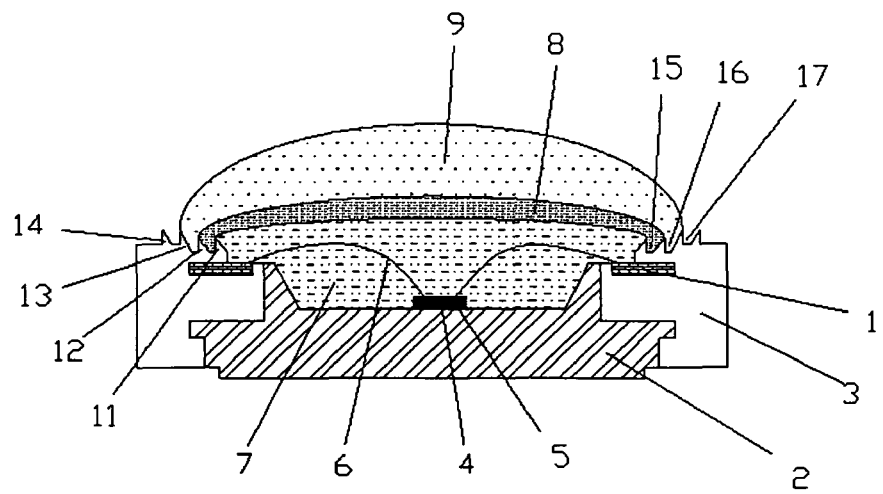
FIG. 5 is a cross-sectional view of the multi-layered LED package using the LED leadframe package of the invention

The LED leadframe package of the invention can be used in making multilayered encapsulation LED package with convex encapsulation shapes by using dispensing method and utilizing surface tension at each sharp edge of ring-alike structures as shown in FIG. 5. FIG. 5 shows a white LED package with multilayered encapsulation structure having outer convex surface and inner conformal concave surface. The curvature of the top surface of each encapsulation layer can be controlled by regulating the amount of dispensed materials. The outer convex shape of encapsulation layers 7, 8, and 9 of the multilayered white LED package as an example of application of the present LED leadframe package are formed by surface tension at the sharp edge of the ring-alike structures 11, 12, and 13, respectively. The encapsulation layer 7 is formed by dispensing silicone material at an appropriate amount into the reflective cup 10 to form surface tension at the sharp edge of the ring-alike structure 11. The dispensed silicone is then solidified by using thermal or UV radiating curing method. Similarly, the encapsulation layers 8 and 9 are formed by dispensing appropriate materials at an appropriate amount to the package to form surface tension at the sharp edge of the ring-alike structures 12 and 13, respectively.

Figure 6A:
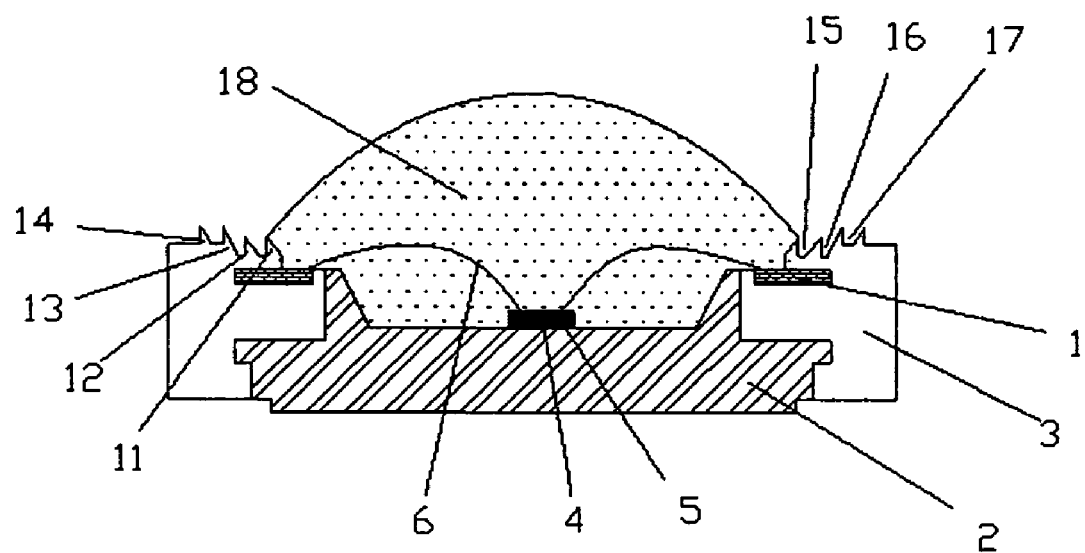
FIG. 6a is a cross-sectional view of another LED package using the LED leadframe package of the invention
Figure 6B:
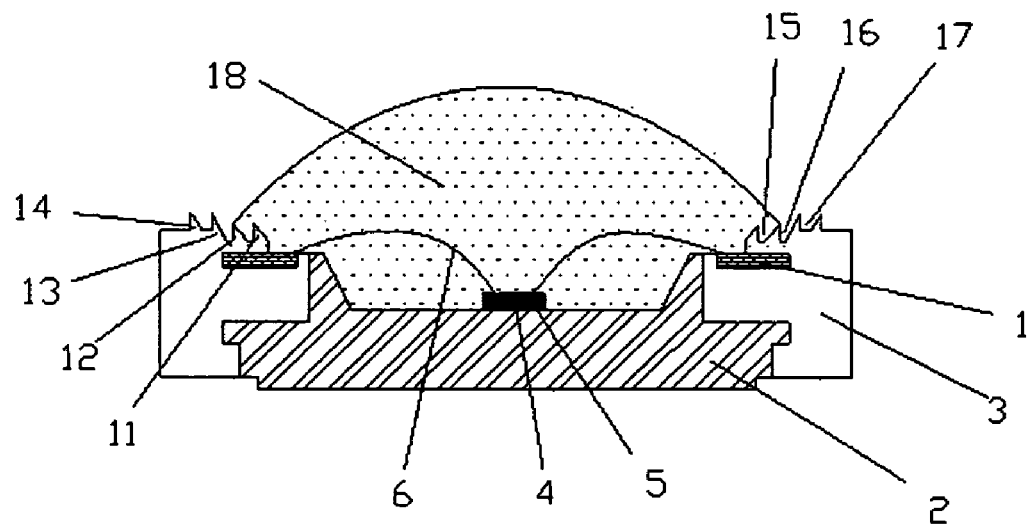
FIG. 6b is a cross-sectional view of another LED package using the LED leadframe package of the invention

FIG. 6a and FIG. 6b show LED packages as examples to illustrate the application of the LED leadframe package of the present invention that can give high manufacturing yield. FIG. 6a shows a color LED package having a silicone encapsulation layer 18 that completely covers a LED die 4, a die attach material 5, and gold wires 6. The silicone encapsulation layer 18 with an outer convex surface is formed by dispensing silicone material into the reflective cup 10 of the heat dissipation base 2 at an appropriate amount to form surface tension at the sharp edge of the first ring-alike structure 11. The dispensed silicone is then solidified by using thermal or UV radiating curing method. During transferring the package from one stage to another stage, the dispensed silicone can be spilled out in a normal package. However, the LED leadframe package of the present invention with multiple ring-alike structures and multiple ring-alike grooves can prevent the spillage. If the spillage happens, the dispensed silicone 18 is spread out from the ring-alike structure 11 into the ring-alike groove 15 and to the ring-alike structure 12 and forms surface tension at the sharp edge of the ring-alike structure 12, resulting in another group of LED package as shown in FIG. 6b. Therefore, the LED leadframe package of the present invention can provide high manufacturing yield and cost effective.

In contrast to the present invention, the convex structure of a conventional LED package is formed by picking a pre-made convex lens and placing it onto the package. This pick-and-place step is required an additional machine and increases capital investment as well as energy. Moreover, the package using the pick-and-place step for making convex structure can have bubbles at the interface between the pre-made convex lens and the encapsulation layer. Therefore, the pick-and-place method has a low yield and high manufacturing cost.

What is claimed is:

1. A leadframe package comprising:
    a heat dissipation base;
    a plurality of electrodes disposed around the heat dissipation base;
    a supporter surrounding and fixing the heat dissipation base and the plurality of electrodes;
    at least two ring-shaped structures protruding upward formed around a top surface of the supporter; and
    at least one ring-shaped groove formed between the at least two ring-shaped structures,
    wherein each of the ring-shaped structures has a sharp top edge and two side surfaces,
    wherein one side surface facing a center portion of the leadframe package is tilted and another side surface facing an outer portion of the leadframe package is vertically formed.

2. A leadframe package of claim 1, wherein the supporter is formed of a PPA plastic.

3. The leadframe package of claim 1, wherein the plurality of electrodes have first ends facing a lateral surface of the heat dissipation base and second ends out of an outer lateral surface of the supporter.

4. The leadframe package of claim 1, wherein the heat dissipation base has a reflective cup whose bottom surface is coated with a reflective material.

5. The leadframe package of claim 1, wherein the heat dissipation base, the plurality of electrodes, and the supporter are bound together by using injection molding method.

6. The leadframe package of claim 1, wherein the at least two ring-shaped structures and the at least one ring-shaped groove are formed on the top surface of the supporter by using a transfer molding method.

7. An LED package comprising a leadframe package according to claim 1.

8. The LED package of claim 7, further comprising:
    at least one LED die mounted on a top surface of the heat dissipation base;
    a plurality of wires electrically connecting the at least one LED die with the plurality of electrodes; and
    at least one encapsulation layer covering the LED die and having a convex outer surface.

9. The LED package of claim 8, wherein an outer edge of each encapsulation layer extends to a corresponding one of the at least two ring-shaped structures.

10. The LED package of claim 9, wherein the curvature of the top surface of each encapsulation layer is controlled by regulating the amount of material which is provided to each encapsulation layer.

11. The LED package of claim 10, wherein each of the at least one encapsulation layer has a convex outer surface formed by surface tension at a sharp top edge of the corresponding one of the at least two ring-shaped structures.

12. The LED package of claim 8, wherein the at least one encapsulation layer completely covers the LED die and the plurality of wires.

13. The LED package of claim 8, wherein the at least one encapsulation layer is made from silicone resin.

14. A leadframe package comprising:
    a heat dissipation base;
    a plurality of electrodes disposed around the heat dissipation base;
    a supporter surrounding and fixing the heat dissipation base and the plurality of electrodes;
    at least two ring-shaped structures protruding upward formed around a top surface of the supporter; and
    at least one ring-shaped groove formed between the at least two ring-shaped structures,
    wherein each of the at least one ring-shaped groove has a bottom surface and two side surfaces, the two side surfaces being extended from the both sides of the bottom surface,
    wherein one side surface facing a center portion of the leadframe package is tilted and another side surface facing an outer portion of the leadframe package is vertically formed.

* * * * *